US012642104B2

(12) United States Patent
Chen et al.

(10) Patent No.: US 12,642,104 B2
(45) Date of Patent: May 26, 2026

(54) PACKAGE SUBSTRATE WITH EMBEDDED DEVICE, AND MANUFACTURING METHOD THEREFOR

(71) Applicant: Zhuhai ACCESS Semiconductor Co., LTD., Zhuhai City (CN)

(72) Inventors: Xianming Chen, Zhuhai City (CN); Wenjian Lin, Zhuhai City (CN); Benxia Huang, Zhuhai City (CN); Gao Huang, Zhuhai City (CN)

(73) Assignee: Zhuhai ACCESS Semiconductor Co., LTD., Zhuhai City (CN)

( * ) Notice: Subject to any disclaimer, the term of this patent is extended or adjusted under 35 U.S.C. 154(b) by 405 days.

(21) Appl. No.: 18/446,428

(22) Filed: Aug. 8, 2023

(65) Prior Publication Data

US 2024/0047227 A1 Feb. 8, 2024

(30) Foreign Application Priority Data

Aug. 8, 2022 (CN) .......................... 202210945044.6

(51) Int. Cl.
*H10W 70/05* (2026.01)
*H10P 14/20* (2026.01)
(Continued)

(52) U.S. Cl.
CPC ............. *H10W 70/05* (2026.01); *H10P 14/22* (2026.01); *H10P 14/3241* (2026.01);
(Continued)

(58) Field of Classification Search
CPC ........... H01L 21/4857; H01L 21/02491; H01L 21/02631; H01L 21/486; H01L 21/568;
(Continued)

(56) References Cited

U.S. PATENT DOCUMENTS

2014/0279306 A1 9/2014 Shi
2015/0109748 A1 4/2015 Yu
(Continued)

FOREIGN PATENT DOCUMENTS

CN 101236943 A 8/2008
CN 105244307 A 1/2016
(Continued)

OTHER PUBLICATIONS

Decision to Grant a Patent for Japanese Patent Application No. 2023-127574 and English translation, mailed Aug. 6, 2024, 5 pages.
(Continued)

*Primary Examiner* — Dale E Page
*Assistant Examiner* — Quovaunda Jefferson
(74) *Attorney, Agent, or Firm* — Buchalter; Jason W. Croft

(57) ABSTRACT

A package substrate with an embedded device and a manufacturing method therefor are disclosed. The method includes: manufacturing a third circuit layer and a target on a temporary carrier plate, and laminating a third dielectric layer; placing a device to be embedded on the third dielectric layer which is then covered with a second dielectric layer; laminating a second copper foil and manufacturing a second circuit layer, a second copper pillar, and a third copper pillar; laminating a first dielectric layer and a first copper foil sequentially, and removing the temporary carrier plate; laminating a fourth dielectric layer on the third circuit layer; laminating a fourth copper foil on the fourth dielectric layer; and manufacturing a fourth circuit layer and a fourth copper pillar through the fourth copper foil, and manufacturing a first circuit layer and a first copper pillar through the first copper foil.

9 Claims, 3 Drawing Sheets

(51) Int. Cl.

| | |
|---|---|
| *H10P 14/22* | (2026.01) |
| *H10P 72/70* | (2026.01) |
| *H10W 70/65* | (2026.01) |
| *H10W 70/685* | (2026.01) |
| *H10W 72/00* | (2026.01) |
| *H10W 74/00* | (2026.01) |
| *H10W 74/01* | (2026.01) |
| *H10W 90/00* | (2026.01) |

(52) U.S. Cl.
CPC ......... *H10W 70/095* (2026.01); *H10W 70/65* (2026.01); *H10W 70/685* (2026.01); *H10W 74/019* (2026.01); *H10P 72/7424* (2026.01); *H10P 72/743* (2026.01); *H10W 72/01204* (2026.01); *H10W 72/01238* (2026.01); *H10W 74/00* (2026.01); *H10W 90/724* (2026.01)

(58) Field of Classification Search
CPC . H01L 21/6835; H01L 21/4846; H01L 21/56; H01L 21/768; H01L 23/49822; H01L 23/49838; H01L 23/3121; H01L 23/5389; H01L 23/3107; H01L 23/49894; H01L 23/53228; H01L 23/5384; H01L 23/562; H01L 24/11; H01L 24/16; H01L 2221/68345; H01L 2221/68359; H01L 2224/11001; H01L 2224/1145; H01L 2224/16235; H01L 2224/18; H01L 2924/01029; H01L 2924/182; H05K 1/185; H05K 2201/01; H10W 70/05; H10W 70/095; H10W 70/65; H10W 70/685; H10W 70/60; H10W 70/614; H10W 70/69; H10W 70/635; H10W 74/00; H10W 74/01; H10W 74/019; H10W 74/111; H10W 74/114; H10W 90/724; H10W 20/01; H10W 20/4421; H10W 42/121; H10P 14/22; H10P 14/3241; H10P 72/7424; H10P 72/743; H10P 72/01204; H10P 72/01238; H10P 72/74

See application file for complete search history.

(56)        References Cited

U.S. PATENT DOCUMENTS

| | | | |
|---|---|---|---|
| 2020/0120804 A1* | 4/2020 | Chen ................... | H01L 23/5389 |
| 2021/0296295 A1* | 9/2021 | Ng .......................... | H01L 24/82 |
| 2021/0320069 A1 | 10/2021 | Jeng | |

FOREIGN PATENT DOCUMENTS

| | | |
|---|---|---|
| CN | 108538803 A | 9/2018 |
| CN | 211150550 U | 7/2020 |
| CN | 111952201 A | 11/2020 |
| CN | 112103195 B | 7/2021 |
| CN | 114567975 A | 5/2022 |
| JP | 2008300482 A | 12/2008 |
| JP | 2012044163 A | 3/2012 |
| JP | 2012080030 A | 4/2012 |
| JP | 2019067864 A | 4/2019 |
| JP | 2020061542 A | 4/2020 |
| JP | 2021040118 A | 3/2021 |
| KR | 20060070930 A | 6/2006 |
| KR | 20060095813 A | 9/2006 |
| WO | 2021136794 A1 | 7/2021 |

OTHER PUBLICATIONS

First Office Action for Korean Patent Application No. 10-2023-0101015 and English translation, mailed Jul. 22, 2024, 19 pages.

First Search Report for Chinese Patent Application No. 2022109450446 and English translation, mailed Jul. 27, 2023, 5 pages.

First Search for Taiwanese Patent Application No. 112116337 and English translation, mailed Sep. 20, 2023, 5 pages.

* cited by examiner

PACKAGE SUBSTRATE WITH EMBEDDED DEVICE, AND MANUFACTURING METHOD THEREFOR

TECHNICAL FIELD

The present application relates to the technical field of semiconductor manufacturing, and in particular, to a package substrate with an embedded device and a manufacturing method therefor.

BACKGROUND

In the existing technology, the manufacturing of a substrate with an embedded device requires a cavity manufactured in the substrate, followed by mounting the device to be embedded in the cavity, and laminating a dielectric material to fill the cavity and covering the device to be embedded. However, the process of manufacturing the substrate needs to manufacture the cavity in the substrate, resulting in a long process flow and a high cost. Moreover, the manufacturing process easily leads to warping of the substrate, resulting in a decrease in the final yield and a waste of resources. Therefore, there is an urgent need for a novel manufacturing method for a package substrate with an embedded device.

SUMMARY

The present application aims at solving at least one of the above-mentioned technical problems in the existing technology to some extent.

To this end, an object of the embodiments of the present application is to provide a manufacturing method for a package substrate with an embedded device. The method can reduce warpage of the substrate, improve a product yield, and save production costs.

The manufacturing method comprises:

manufacturing a third circuit layer and a target on an upper surface of a temporary carrier plate, and laminating a third dielectric layer on the third circuit layer and the target;

placing a device to be embedded on the third dielectric layer and covering the device to be embedded with a second dielectric layer, wherein a pin of the device to be embedded is arranged opposite to the third dielectric layer;

laminating a second copper foil on an upper surface of the second dielectric layer, and manufacturing a second circuit layer, a second copper pillar, and a third copper pillar through the second copper foil;

laminating a first dielectric layer on the second circuit layer, the second copper pillar, and the third copper pillar, laminating a first copper foil on an upper surface of the first dielectric layer, and removing the temporary carrier plate;

laminating a fourth dielectric layer on a lower surface of the third circuit layer, and laminating a fourth copper foil on a lower surface of the fourth dielectric layer; and manufacturing a fourth circuit layer and a fourth copper pillar through the fourth copper foil, and manufacturing a first circuit layer and a first copper pillar through the first copper foil;

or, manufacturing a target on a temporary carrier plate, and laminating a third dielectric layer on the target;

placing a device to be embedded on the third dielectric layer and covering the device to be embedded with a second dielectric layer, wherein a pin of the device to be embedded is attached to the third dielectric layer;

laminating a second copper foil on an upper surface of the second dielectric layer, and manufacturing a third circuit layer through the second copper foil;

covering the third circuit layer with a first dielectric layer, laminating a first copper foil on an upper surface of the first dielectric layer, and removing the temporary carrier plate to expose a lower surface of the third dielectric layer;

manufacturing a second circuit layer, a second copper pillar and a third copper pillar on the lower surface of the third dielectric layer;

laminating the fourth dielectric layer on the second circuit layer, the second copper pillar and the third copper pillar, and laminating a fourth copper foil on a lower surface of the fourth dielectric layer; and manufacturing a first circuit layer and a first copper pillar through the fourth copper foil, and manufacturing a fourth circuit layer and a fourth copper pillar through the first copper foil.

In addition, the manufacturing method for a package substrate with an embedded device according to the above embodiment of the present application may further have the following additional technical features.

Further, in the embodiments of the present application, the manufacturing a second circuit layer, a second copper pillar and a third copper pillar through the second copper foil comprises: manufacturing a second via hole and a third via hole, wherein the second via hole penetrates through the third dielectric layer and the second dielectric layer; manufacturing a second metal seed layer on the second copper foil, the second via hole and the third via hole; and manufacturing the second circuit layer, the second copper pillar and the third copper pillar on the second metal seed layer.

Further, in the embodiments of the present application, the manufacturing a first circuit layer and a first copper pillar through the first copper foil comprises: manufacturing a first via hole; manufacturing a first metal seed layer on the first copper foil and the first via hole; and manufacturing the first circuit layer and the first copper pillar on the first metal seed layer.

Further, in the embodiments of the present application, the manufacturing a second circuit layer, a second copper pillar and a third copper pillar on the lower surface of the third dielectric layer comprises: manufacturing a second via hole and a third via hole on the lower surface of the third dielectric layer, wherein the second via hole penetrates through the third dielectric layer and the second dielectric layer; manufacturing a second metal seed layer on the lower surface of the third dielectric layer, the second via hole and the third via hole; and manufacturing the second circuit layer, the second copper pillar and the third copper pillar on the second metal seed layer.

Further, in the embodiments of the present application, the laminating a third dielectric layer on the third circuit layer and the target comprises: laminating a viscous dielectric layer on the third circuit layer and the target, wherein the viscous dielectric layer is used for fixing the device to be embedded.

Further, in the embodiments of the present application, the manufacturing a second metal seed layer on the second copper foil, the second via hole and the third via hole comprises: manufacturing the second metal seed layer on the second copper foil, the second via hole and the third via hole using a chemical deposition method or a physical sputtering method.

Further, in the embodiments of the present application, the laminating a third dielectric layer on the third circuit layer and the target comprises: laminating the third dielectric layer on the third circuit layer and the target by a vacuum laminator or a laminating machine.

Further, in the embodiments of the present application, the manufacturing a second circuit layer, a second copper pillar and a third copper pillar on the second metal seed layer comprises: manufacturing the second circuit layer, the second copper pillar and the third copper pillar on the second metal seed layer using an improved semi-additive method or a tenting method.

In another aspect, the embodiments of the present application further provide a package substrate with an embedded device, which is manufactured by the manufacturing method for a package substrate with an embedded device in any of the embodiments mentioned above.

Advantages and beneficial effects of the present application will be given in part in the following description, and some will become apparent from the following description, or may be learned from the practice of the present application.

In the present application, the device to be embedded may be directly embedded into the substrate by covering it with the dielectric layer on the temporary carrier plate without increasing the cavity for manufacturing and placing the embedded device, and the temporary carrier plate can be removed after the device is embedded, thereby avoiding the influence of the overall warping of the substrate after the dielectric material is cured on the yield of the product, which is caused by the stress generated in the subsequent laminating and curing process as the temporary carrier plate does not shrink along with the dielectric material or the shrinkage of the temporary carrier plate is not the same as the dielectric material.

DETAILED DESCRIPTION

The embodiments of the present application will be described in detail below with reference to the drawings, and the principles and processes of the manufacturing method for a package substrate with an embedded device in the embodiments of the present application are described below.

Figure 1:
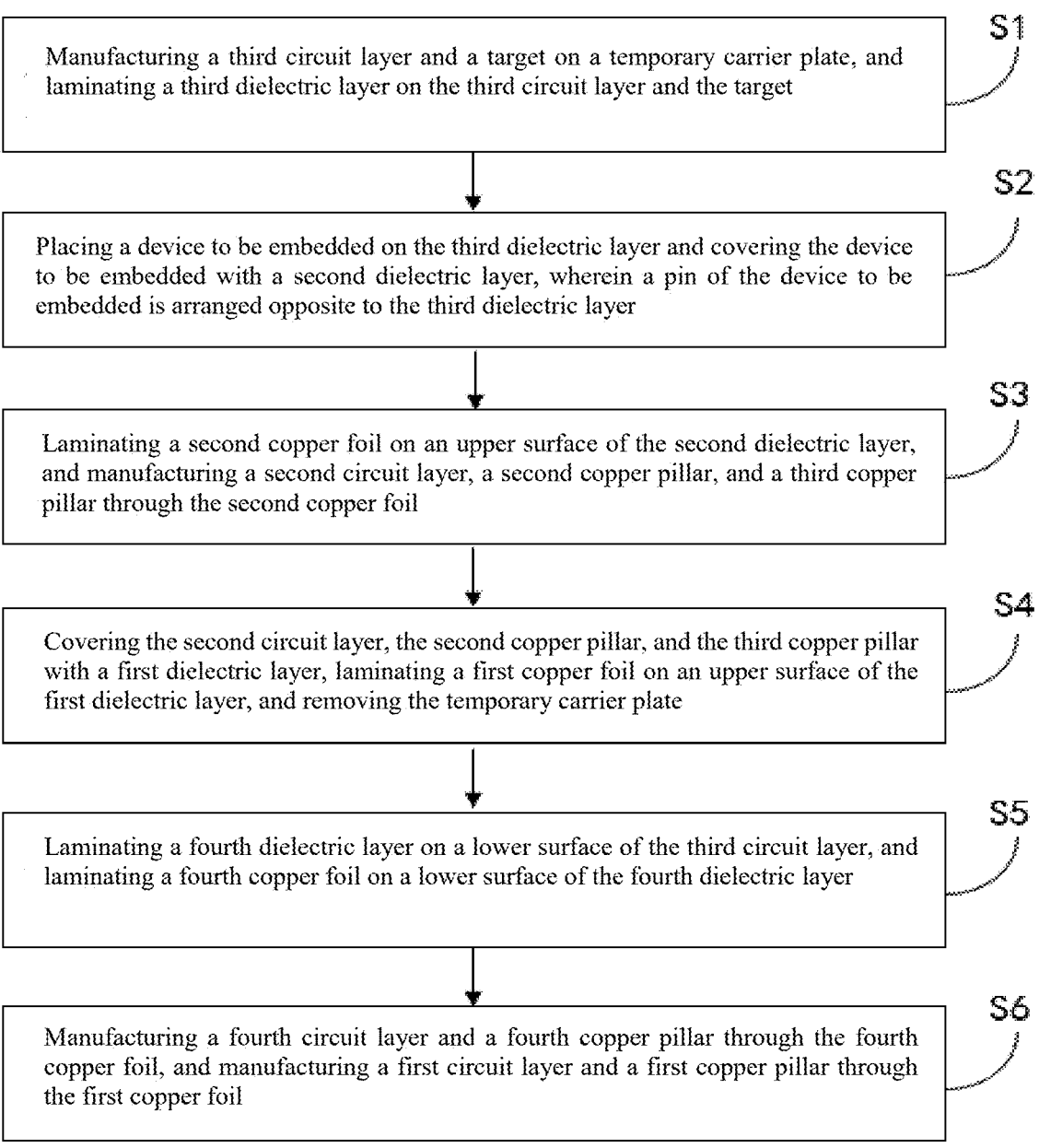
FIG. 1 is a schematic diagram showing steps of a manufacturing method for a package substrate with an embedded device according to an embodiment of the present application.
Figure 2:
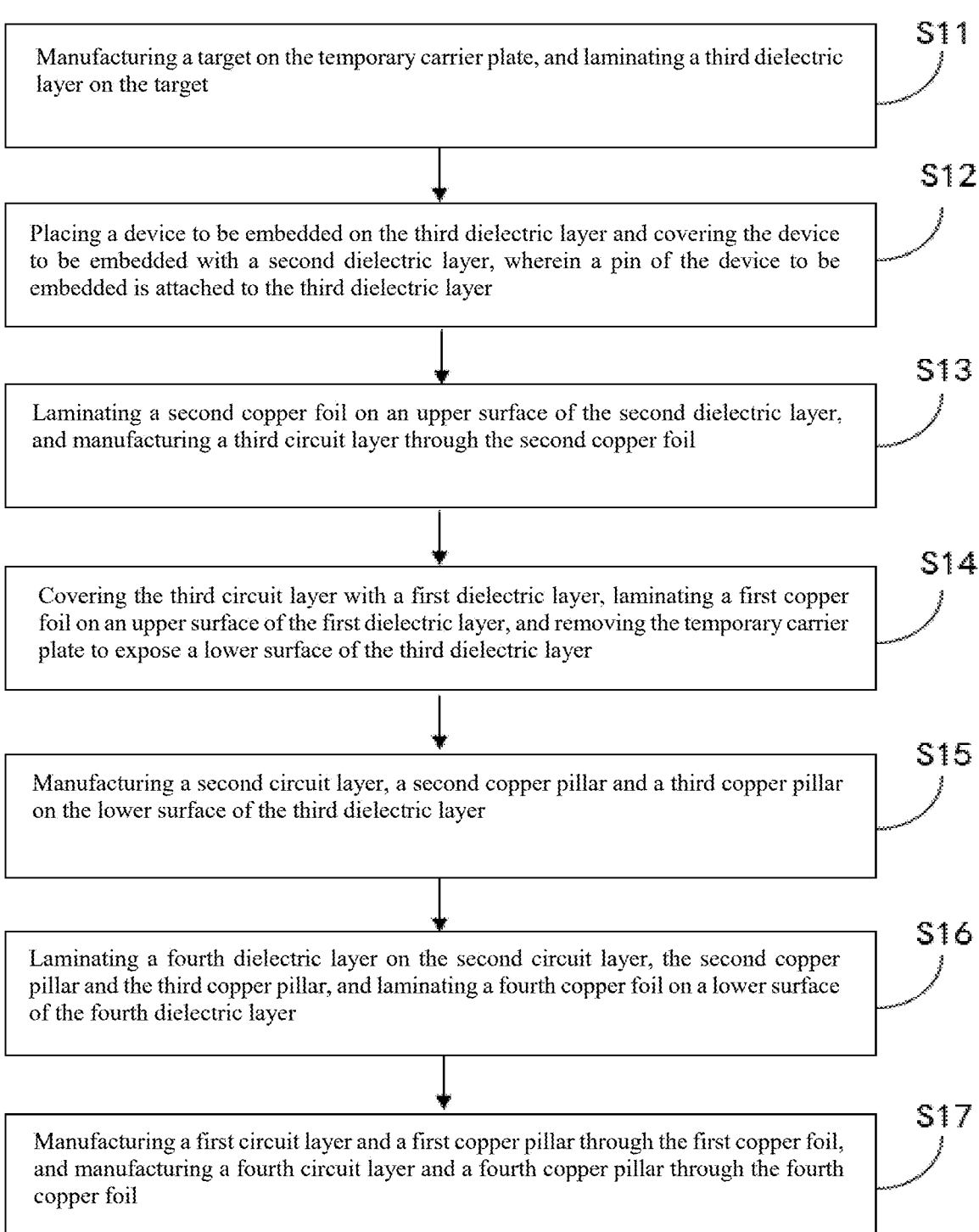
FIG. 2 is a schematic diagram showing steps of a manufacturing method for a package substrate with an embedded device according to another embodiment of the present application.

Referring to FIG. 1 and FIG. 2, a manufacturing method for a package substrate with an embedded device according to the present application comprises the following steps of:

S1. manufacturing a third circuit layer and a target on a temporary carrier plate, and laminating a third dielectric layer on the third circuit layer and the target;

S2. placing a device to be embedded on the third dielectric layer and covering the device to be embedded with a second dielectric layer, wherein a pin of the device to be embedded is arranged opposite to the third dielectric layer;

S3. laminating a second copper foil on an upper surface of the second dielectric layer, and manufacturing a second circuit layer, a second copper pillar, and a third copper pillar through the second copper foil;

S4. laminating a first dielectric layer on the second circuit layer, the second copper pillar, and the third copper pillar, laminating a first copper foil on an upper surface of the first dielectric layer, and removing the temporary carrier plate;

S5. laminating a fourth dielectric layer on a lower surface of the third circuit layer, and laminating a fourth copper foil on a lower surface of the fourth dielectric layer; and S6. manufacturing a fourth circuit layer and a fourth copper pillar through the fourth copper foil, and manufacturing a first circuit layer and a first copper pillar through the first copper foil.

Alternatively, the manufacturing method may comprise the following steps of:

S11. manufacturing a target on a temporary carrier plate, and laminating a third dielectric layer on the target;

S12. placing a device to be embedded on the third dielectric layer and covering the device to be embedded with a second dielectric layer, wherein a pin of the device to be embedded is attached to the third dielectric layer;

S13. laminating a second copper foil on an upper surface of the second dielectric layer, and manufacturing a third circuit layer through a second copper foil;

S14. covering the third circuit layer with a first dielectric layer, laminating a first copper foil on an upper surface of the first dielectric layer, and removing the temporary carrier plate to expose a lower surface of the third dielectric layer;

S15. manufacturing a second circuit layer, a second copper pillar and a third copper pillar on the lower surface of the third dielectric layer;

S16. laminating a fourth dielectric layer on the second circuit layer, the second copper pillar and the third copper pillar, and laminating a fourth copper foil on a lower surface of the fourth dielectric layer; and S17. manufacturing a first circuit layer and a first copper pillar through the fourth copper foil, and manufacturing a fourth circuit layer and a fourth copper pillar through the first copper foil.

Specifically, in some embodiments of the present application, the first circuit layer is disposed at an uppermost portion of the entire package substrate, and the fourth circuit layer is located at a lowermost portion of the substrate. The second circuit layer is a circuit layer directly connected to the embedded device, and the second circuit layer is further connected to the first circuit layer. The third circuit layer is a circuit layer connected to the second circuit layer and connected to the fourth circuit layer, the first dielectric layer is a dielectric layer carrying the first circuit layer, the fourth dielectric layer is a dielectric layer carrying the fourth circuit layer, the third dielectric layer is a dielectric layer for fixing the device to be embedded, and the second dielectric layer is a dielectric layer covering the entire embedded device. The first dielectric layer and the fourth dielectric layer may be made of a PP material (a polypropylene material), and the third dielectric layer may be made of a dielectric material having viscosity to fix the embedded device. The second dielectric layer may be made of a fiberglass-free dielectric material. The first circuit layer and the second circuit layer may be connected by means of the first copper pillar. The second circuit layer is a circuit layer connected to the embedded device, and the second circuit layer may be connected to the embedded device by means of the second copper pillar. The third circuit layer may be connected to the second circuit layer by means of the third copper pillar passing through the second dielectric layer covering the embedded device and the third dielectric layer for fixing the embedded device. The fourth circuit layer is connected to the third circuit layer through a fourth copper pillar. In the manufacturing process, the first copper foil, the second copper foil, the third copper foil and the fourth copper foil used for manufacturing the circuits may be tightly attached to the corresponding dielectric layer by laminating.

Further, in S3, the manufacturing a second circuit layer, a second copper pillar and a third copper pillar through the second copper foil specifically comprises:

S111. manufacturing a second via hole and a third via hole, wherein the second via hole penetrates through the third dielectric layer and the second dielectric layer;

S112. manufacturing a second metal seed layer on the second copper foil, the second via hole and the third via hole; and S113. manufacturing the second circuit layer, the second copper pillar and the third copper pillar on the second metal seed layer.

Specifically, the second via hole and the third via hole may be manufactured in the second copper foil and the second dielectric layer through laser drilling, wherein the second via hole needs to penetrate through the second dielectric layer and the third dielectric layer, and the third circuit layer needs to be exposed from the second via hole, so as to facilitate subsequent manufacturing of the third copper pillar for connecting the third circuit layer and the second circuit layer, and when the third via hole is manufactured, the pin of the embedded device needs to be exposed from the third via hole. After drilling, a seed layer needs to be formed on the second via hole, the third via hole and the drilled copper foil, and the seed layer may be used for subsequent manufacturing of the second circuit layer. After the metal seed layer is completed, the second circuit layer may be made on the seed layer. In addition, it should be noted that the number of the third via hole and the third copper pillar may be determined according to the pin of the embedded device, while the number of the second via hole and the second copper pillar may be selected according to specific circuit function in practical application, which may be one or more, and is not limited here.

Further, in S6, the manufacturing a first circuit layer and a first copper pillar through the first copper foil specifically comprises:

S211. manufacturing a first via hole;

S212. manufacturing a first metal seed layer on the first copper foil and the first via hole; and S213. manufacturing the first circuit layer and the first copper pillar on the first metal seed layer.

Specifically, in the present application, the first via hole needs to penetrate through the entire first dielectric layer, while one or more first via holes may be provided according to the specific actual application. The first via hole may be manufactured by a laser drilling process. After the first via hole is manufactured, the first metal seed layer is covered on the first copper foil and the first via hole, the metal seed layer needs to completely cover the drilled first copper foil and the first via hole, and the metal seed layer may be manufactured using a chemical deposition method or a physical sputtering method. After the manufacturing of the metal seed layer is completed, the first circuit layer and the first copper pillar need to be manufactured through the metal seed layer.

Further, in S15, the manufacturing a second circuit layer, a second copper pillar and a third copper pillar on the lower surface of the third dielectric layer specifically comprises:

S221. manufacturing a second via hole and a third via hole on the lower surface of the third dielectric layer, wherein the second via hole penetrates through the third dielectric layer and the second dielectric layer;

S222. manufacturing a second metal seed layer on the lower surface of the third dielectric layer, the second via hole and the third via hole; and S223. manufacturing the second circuit layer, the second copper pillar and the third copper pillar on the second metal seed layer.

The second via hole and the third via hole may be manufactured through laser drilling on the lower surface of the third dielectric layer, wherein the second via hole needs to penetrate through the second dielectric layer and the third dielectric layer, and the third circuit layer needs to be exposed from the second via hole, so as to facilitate subsequent manufacturing of the third copper pillar for connecting the third circuit layer with the second circuit layer, and when the third via hole is manufactured, the pin of the embedded device needs to be exposed from the third via hole. After drilling, a seed layer needs to be formed on the second via hole, the third via hole and the drilled copper foil, and the seed layer may be used for subsequent manufacturing of the second circuit layer. After the metal seed layer is completed, the second circuit layer may be made on the seed layer.

Further, the second metal seed layer is manufactured on the second copper foil, the second via hole and the third via hole using a chemical deposition method or a physical sputtering method.

Specifically, in some embodiments of the present application, the second metal seed layer may be manufactured using a chemical deposition method or a physical sputtering method. Further, the chemical deposition method may be chemical vapor deposition with a copper material, while the physical sputtering may be a vacuum magnetron sputtering technology for plating a copper film on the dielectric layer.

Further, in some embodiments of the present application, a thickness of the first dielectric layer is the same as a thickness of the fourth dielectric layer.

Specifically, the first dielectric layer and the fourth dielectric layer may be laminated with a corresponding circuit layer by using a laminating process. Since the laminated dielectric layer has a certain transverse stress, it can avoid the warping issues caused by an asymmetric structure if the thickness of the first dielectric layer and the thickness of the fourth dielectric layer are the same. In addition, the thickness of the first dielectric layer and the thickness of the fourth dielectric layer may also be similar. When the thicknesses of the two dielectric layers are similar, a thickness difference of the two dielectric layers may not exceed 0.05 mm.

Further, in some embodiments of the present application, the third dielectric layer may also be made by a laminating process. When laminating the third dielectric layer, which is made of a viscous material, it is necessary to stick a protective film on one side surface of the third dielectric layer for fixing the embedded device, and the protective film needs to be peeled off before placing the embedded device after laminating.

Further, the third dielectric layer may be laminated on the third circuit layer and the target by a vacuum laminator or laminating machine.

Further, the second circuit layer, the second copper pillar and the third copper pillar may be manufactured on the second metal seed layer by an MSAP process (modified semi-additive process) or the Tenting process.

Figure 3:
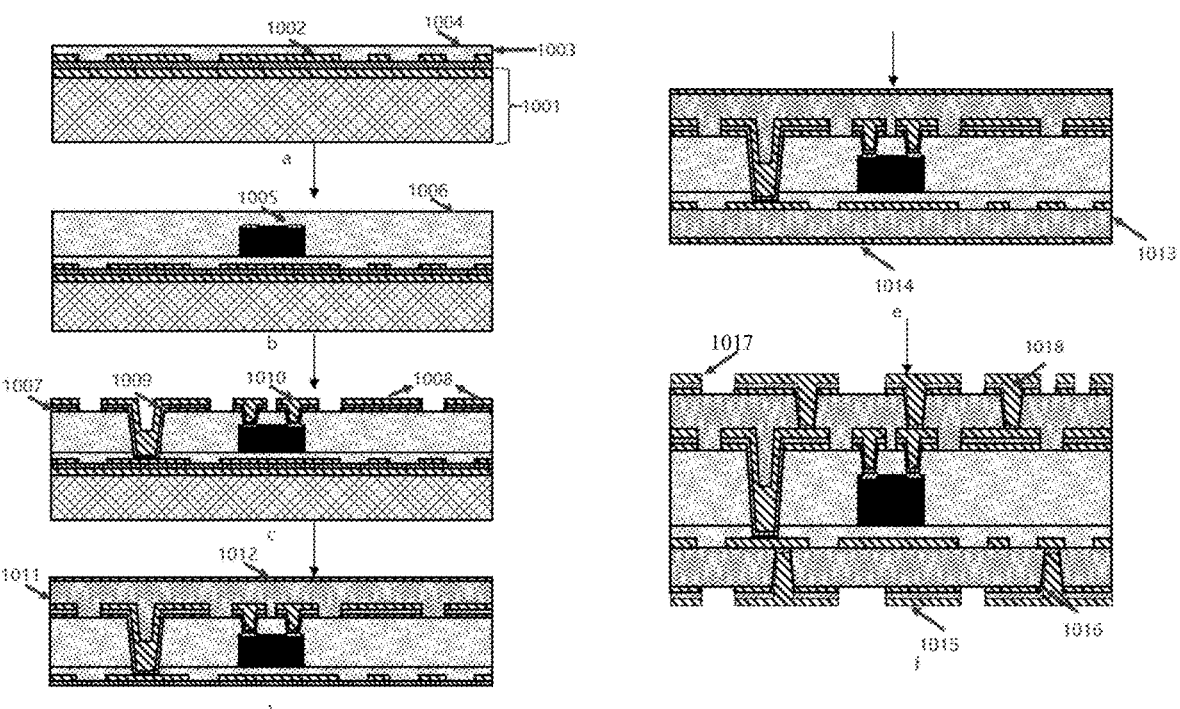
FIG. 3 is a schematic structural diagram showing a manufacturing process of a package substrate with an embedded device according to an embodiment of the present application.
Figure 4:
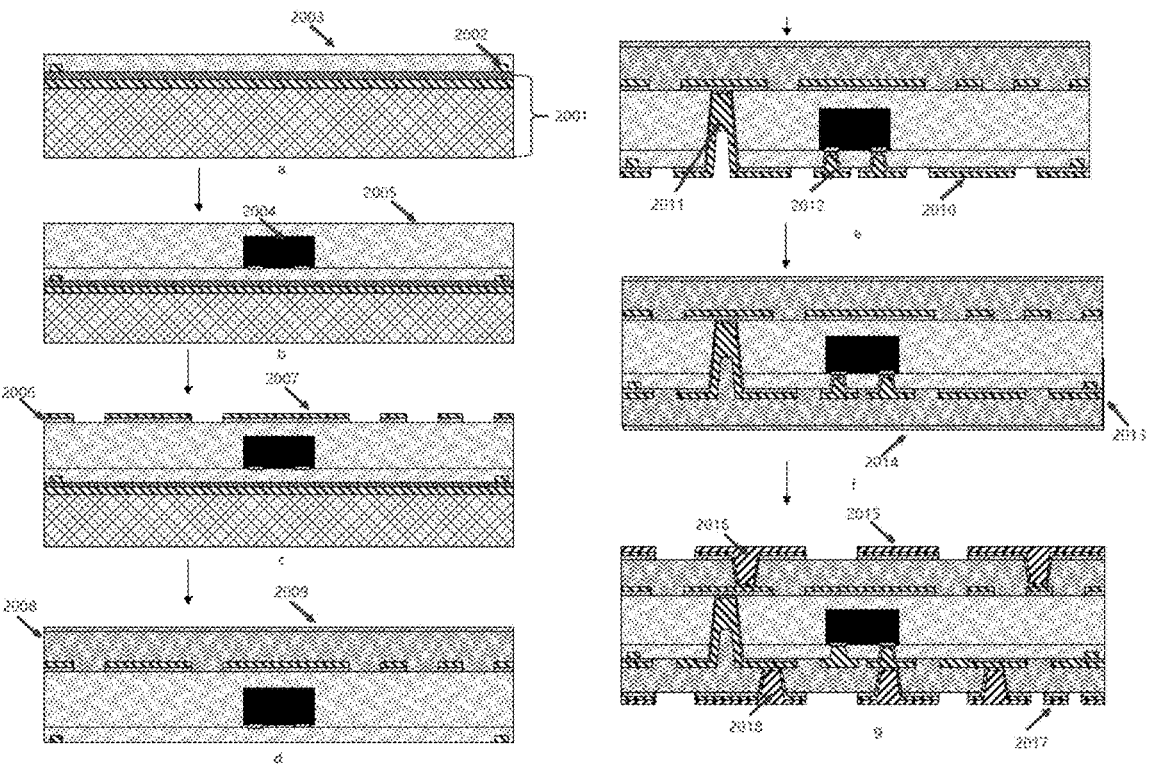
FIG. 4 is a schematic structural diagram showing a manufacturing process of a package substrate with an embedded device according to another embodiment of the present application.

With reference to FIG. 3 and FIG. 4, two manufacturing methods of the package substrate with an embedded device according to the present application are described below.

One method may refer to FIG. 3.

Referring to a of FIG. 3, a temporary carrier plate 1001 comprises a copper foil and a carrier which may be peeled off from each other. Firstly, a third circuit layer 1002 and a target 1003 are manufactured on the temporary carrier plate 1001, and a third dielectric layer 1004 is laminated on the third circuit layer 1002 and the target 1003. The third dielectric layer 1004 is a viscous dielectric layer, which can fix a subsequent embedded device. The target 1003 may be used for positioning the embedded device. The third dielectric layer 1004 may be laminated by a vacuum laminator or a laminating machine. The third circuit layer 1002 may be manufactured by an MSAP process.

Then, referring to b of FIG. 3, a device to be embedded 1005 is placed on the third dielectric layer 1004 and a second dielectric layer 1006 is covered on the device to be embedded 1005. A pin of the device to be embedded 1005 is arranged opposite to the third dielectric layer 1004, the pin of the device to be embedded 1005 faces upwards, a body of the device to be embedded 1005 is bonded with the third dielectric layer 1004, and the target can position the device to be embedded 1005 when placing the device. The second dielectric layer 1006 needs to completely cover the device to be embedded 1005.

Then, referring to c of FIG. 3, a second copper foil 1007 is laminated on an upper surface of the second dielectric layer 1006, and a second circuit layer 1008, a second copper pillar 1009 and a third copper pillar 1010 are manufactured through the second copper foil 1007. The second copper pillar 1009 needs to penetrate through the second dielectric layer 1006 and the third dielectric layer 1004. The third copper pillar 1010 may be electrically connected to the second circuit layer 1008 and the third circuit layer 1002, and the second copper pillar 1009 may be electrically connected to the second circuit layer 1008 and the device to be embedded 1005 between the second circuit layer 1008 and the third circuit layer 1002.

Then, referring to d of FIG. 3, a first dielectric layer 1011 is laminated and covered on the second circuit layer 1008, a first copper foil 1012 is laminated on an upper surface of the first dielectric layer 1011, and the temporary carrier plate 1001 is removed. The first dielectric layer 1011 needs to completely cover the second circuit layer 1008, the second copper pillar 1009 and the third copper pillar 1010. After the first copper foil 1012 is laminated, the temporary carrier plate 1001 may be removed by physical peeling off and etching.

Then, referring to e of FIG. 3, after removing the temporary carrier plate 1001, a fourth dielectric layer 1013 is laminated on a lower surface of the third circuit layer 1002. A fourth copper foil 1014 is laminated on a lower surface of the fourth dielectric layer 1013. When the fourth dielectric layer 1013 is laminated, a dielectric layer made of a PP material with the same thickness as that of the first dielectric layer 1011 may be selected, and a warping phenomenon caused by asymmetry during laminating can be avoided with the same thickness.

Finally, referring to f of FIG. 3, after the fourth copper foil is laminated, a fourth circuit layer 1015 and a fourth copper pillar 1016 may be manufactured through the fourth copper foil 1014, and the first circuit layer 1017 and the first copper pillar 1018 may be manufactured through the first copper foil 1012. Specifically, the first circuit layer 1017 and the fourth circuit layer 1015 may be manufactured at the same time, and the first copper pillar 1018 and the fourth copper pillar 1016 may also be manufactured at the same time. Alternatively, the first circuit layer 1017 may be manufactured first and then the fourth circuit layer 1015 may be manufactured, and finally the first copper pillar 1018 and the fourth copper pillar 1016 may be manufactured. The sequence of steps of the process is not limited here.

In the sub-figures a to f of FIG. 3, only some layers and devices newly added in each manufacturing step are labeled, and the layers and devices already appearing in the previous step are not labeled.

Another method may refer to FIG. 4.

Referring to a of FIG. 4, a target 2002 is manufactured on a temporary carrier plate 2001 first, and a third dielectric layer 2003 is laminated on the target 2002.

Then, referring to b of FIG. 4, a device to be embedded 2004 is placed on the third dielectric layer 2003 and a second dielectric layer 2005 is covered on the device to be embedded 2004. A pin of the device to be embedded 2004 is attached to the third dielectric layer 2003.

Then, referring to c of FIG. 4, a second copper foil 2006 is laminated on an upper surface of the second dielectric layer 2005, and a third circuit layer 2007 is manufactured through the second copper foil 2006.

Then, referring to d of FIG. 4, a first dielectric layer 2008 is covered on the third circuit layer 2007, a first copper foil 2009 is laminated on an upper surface of the first dielectric layer 2008, and the temporary carrier plate 2001 is removed to expose a lower surface of the third dielectric layer 2003.

Then, referring to e of FIG. 4, a second circuit layer 2010, a second copper pillar 2011 and a third copper pillar 2012 are manufactured on the lower surface of the third dielectric layer 2003.

Then, referring to f of FIG. 4, a fourth dielectric layer 2013 is laminated to cover the second circuit layer 2010, the second copper pillar 2011 and the third copper pillar 2012 from below the substrate, and a fourth copper foil 2014 is laminated on a lower surface of the fourth dielectric layer 2013.

Finally, referring to g in FIG. 4, a fourth circuit layer 2015 and a fourth copper pillar 2016 are manufactured through the first copper foil 2009, and a first circuit layer 2017 and a first copper pillar 2018 are manufactured through the fourth copper foil 2014.

It should be noted that in the subfigures a to g of FIG. 4, only some layers and devices newly added in each manufacturing step are labeled, and the layers and devices already appearing in the previous step are not labeled.

In addition, the embodiments of the present application also provide a package substrate with an embedded device which may be manufactured and obtained by the manufacturing method for a package substrate with an embedded device in any of the embodiments mentioned above.

In some alternative embodiments, the functions/operations mentioned in the block diagrams may occur out of the order noted in the operation diagram. For example, two blocks shown in succession may, in fact, be executed substantially concurrently or the blocks may sometimes be executed in the reverse order, depending on the functionality/operation involved. In addition, the embodiments presented and described in the flowchart of the present application are provided by way of example, with the purpose of providing a more comprehensive understanding of the technology. The disclosed methods are not limited to the operations and logic flows presented herein. Alternative embodiments are contemplated in which the order of the various operations is changed and the sub-operations described as a part of a general operation is performed independently.

In the description of this specification, the description with reference to the terms such as "one embodiment/implementation", "another embodiment/implementation", or "some embodiments/implementations" means that the specific features, structures, materials or characteristics described in connection with the embodiment or implementation are included in at least one embodiment or implementation of the present application. In the specification, the schematic representation of the above terms does not necessarily mean the same embodiment or implementation. Moreover, the specific features, structures, materials or characteristics described may be combined in any one or more embodiments or implementations in a suitable manner.

Although the embodiments of the present application have been shown and described, those of ordinary skills in the art should understand that: various changes, amendments, substitutions and modifications can be made to these embodiments without departing from the principles and purposes of the present application, and the scope of the present application is limited by the claims and equivalents thereof.

The foregoing describes the preferred embodiments of the present application in detail, but the present application is not limited to the embodiments, those of ordinary skills in the art can make various equal deformations or replacements without departing from the gist of the present application, and these equal deformations or replacements shall all fall within the scope limited by the claims of the present application.

What is claimed is:

1. A manufacturing method for a package substrate with an embedded device, comprising:

manufacturing a third circuit layer and a target on an upper surface of a temporary carrier plate, and laminating a third dielectric layer on the third circuit layer and the target;

placing a device to be embedded on the third dielectric layer and covering the device to be embedded with a second dielectric layer, wherein a pin of the device to be embedded is arranged opposite to the third dielectric layer;

laminating a second copper foil on an upper surface of the second dielectric layer, and manufacturing a second circuit layer, a second copper pillar, and a third copper pillar through the second copper foil;

laminating a first dielectric layer on the second circuit layer, the second copper pillar, and the third copper pillar, laminating a first copper foil on an upper surface of the first dielectric layer, and removing the temporary carrier plate;

laminating a fourth dielectric layer on a lower surface of the third circuit layer, and laminating a fourth copper foil on a lower surface of the fourth dielectric layer; and manufacturing a fourth circuit layer and a fourth copper pillar through the fourth copper foil, and manufacturing a first circuit layer and a first copper pillar through the first copper foil;

or, manufacturing a target on a temporary carrier plate, and laminating a third dielectric layer on the target;

placing a device to be embedded on the third dielectric layer and covering the device to be embedded with a second dielectric layer, wherein a pin of the device to be embedded is attached to the third dielectric layer;

laminating a second copper foil on an upper surface of the second dielectric layer, and manufacturing a third circuit layer through the second copper foil;

covering the third circuit layer with a first dielectric layer, laminating a first copper foil on an upper surface of the first dielectric layer, and removing the temporary carrier plate to expose a lower surface of the third dielectric layer;

manufacturing a second circuit layer, a second copper pillar and a third copper pillar on the lower surface of the third dielectric layer;

laminating the fourth dielectric layer on the second circuit layer, the second copper pillar and the third copper pillar, and laminating a fourth copper foil on a lower surface of the fourth dielectric layer; and manufacturing a first circuit layer and a first copper pillar through the fourth copper foil, and manufacturing a fourth circuit layer and a fourth copper pillar through the first copper foil;

wherein the manufacturing a second circuit layer, a second copper pillar and a third copper pillar through the second copper foil comprises:

manufacturing a second via hole and a third via hole, wherein the second via hole penetrates through the third dielectric layer and the second dielectric layer;

manufacturing a second metal seed layer on the second copper foil, the second via hole and the third via hole; and manufacturing the second circuit layer, the second copper pillar and the third copper pillar on the second metal seed layer.

2. The manufacturing method for a package substrate with an embedded device according to claim 1, wherein the manufacturing a first circuit layer and a first copper pillar through the first copper foil comprises:

manufacturing a first via hole;

manufacturing a first metal seed layer on the first copper foil and the first via hole; and manufacturing the first circuit layer and the first copper pillar on the first metal seed layer.

3. The manufacturing method for a package substrate with an embedded device according to claim 1, wherein the manufacturing a second circuit layer, a second copper pillar and a third copper pillar on the lower surface of the third dielectric layer comprises:

manufacturing a second via hole and a third via hole on the lower surface of the third dielectric layer, wherein the second via hole penetrates through the third dielectric layer and the second dielectric layer;

manufacturing a second metal seed layer on the lower surface of the third dielectric layer, the second via hole and the third via hole; and manufacturing the second circuit layer, the second copper pillar and the third copper pillar on the second metal seed layer.

4. The method for manufacturing the package substrate with an embedded device according to claim 1, wherein the laminating a third dielectric layer on the third circuit layer and the target comprises:

laminating a viscous dielectric layer on the third circuit layer and the target, wherein the viscous dielectric layer is used for fixing the device to be embedded.

5. The manufacturing method for a package substrate with an embedded device according to claim 1, wherein the manufacturing a second metal seed layer on the second copper foil, the second via hole and the third via hole comprises:

manufacturing the second metal seed layer on the second copper foil, the second via hole and the third via hole using a chemical deposition method or a physical sputtering method.

6. The manufacturing method for a package substrate with an embedded device according to claim 1, wherein a thickness of the first dielectric layer is the same as a thickness of the fourth dielectric layer.

7. The manufacturing method for a package substrate with an embedded device according to claim 1, wherein the laminating a third dielectric layer on the third circuit layer and the target comprises:

laminating the third dielectric layer on the third circuit layer and the target by a vacuum laminator or a laminating machine.

8. The manufacturing method for a package substrate with an embedded device according to claim 3, wherein the manufacturing a second circuit layer, a second copper pillar and a third copper pillar on the second metal seed layer comprises:

manufacturing the second circuit layer, the second copper pillar and the third copper pillar on the second metal seed layer using an improved semi-additive method or a tenting method.

9. A package substrate with an embedded device, manufactured by the manufacturing method for a package substrate with an embedded device according to claim 1.

* * * * *